(12) United States Patent
Liaw

(10) Patent No.: US 10,964,695 B2
(45) Date of Patent: Mar. 30, 2021

(54) SEMICONDUCTOR STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 124 days.

(21) Appl. No.: 16/211,656

(22) Filed: Dec. 6, 2018

(65) Prior Publication Data

US 2020/0135762 A1 Apr. 30, 2020

Related U.S. Application Data

(60) Provisional application No. 62/752,691, filed on Oct. 30, 2018.

(51) Int. Cl.
*H01L 27/088* (2006.01)
*H01L 23/522* (2006.01)
*H01L 29/78* (2006.01)
*H01L 27/118* (2006.01)

(52) U.S. Cl.
CPC ...... *H01L 27/0886* (2013.01); *H01L 23/5226* (2013.01); *H01L 29/7855* (2013.01); *H01L 2027/11829* (2013.01); *H01L 2027/11866* (2013.01)

(58) Field of Classification Search
CPC .......... H01L 29/7855; H01L 27/11521–11529; H01L 27/0886
See application file for complete search history.

(56) References Cited

U.S. PATENT DOCUMENTS

| 8,796,093 B1 * | 8/2014 | Cheng | ............... H01L 29/66545 438/268 |
| 9,613,953 B2 | 4/2017 | Liaw | |
| 9,793,273 B2 | 10/2017 | Liaw | |
| 9,805,985 B2 | 10/2017 | Liaw | |

* cited by examiner

*Primary Examiner* — Amar Movva
(74) *Attorney, Agent, or Firm* — Birch, Stewart, Kolasch & Birch, LLP

(57) ABSTRACT

Semiconductor structures are provided. Each of the transistors includes a first source/drain region over a semiconductor fin extending in a first direction, a second source/drain region over the semiconductor fin, a channel region in the semiconductor fin and between the first and second source/drain regions, and a metal gate electrode formed on the channel region and extending in a second direction perpendicular to the first direction. In a first transistor of the transistors, a first source/drain region is formed between the metal gate electrode of the first transistor and the metal gate electrode of a second transistor of the transistors, A second source/drain region is formed between the metal gate electrode of the first transistor and the dielectric-base dummy gate extending in the second direction. A first contact of the first source/drain region is narrower than a second contact of the second source/drain region along the first direction.

20 Claims, 5 Drawing Sheets

SEMICONDUCTOR STRUCTURE

CROSS REFERENCE TO RELATED APPLICATIONS

This Application claims priority of U.S. Provisional Application No. 62/752,691, filed on Oct. 30, 2018, the entirety of which is incorporated by reference herein.

BACKGROUND

The recent trend in miniaturizing integrated circuits (ICs) has resulted in smaller devices which consume less power, yet provide more functionality at higher speeds than before. The miniaturization process has also resulted in various developments in IC designs and/or manufacturing processes to ensure the desired production yield and the intended performance.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
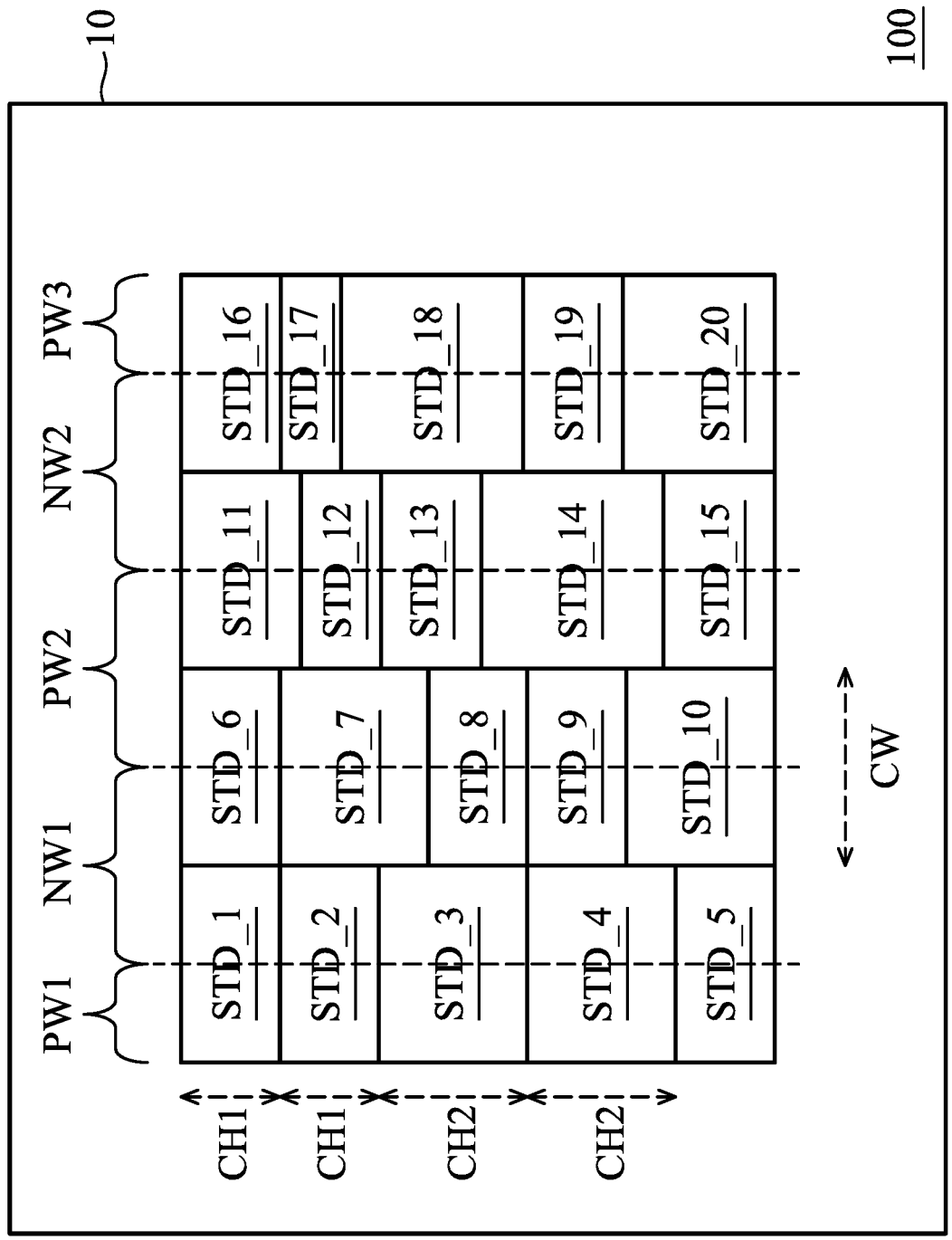
FIG. 1 is a simplified diagram of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1 is a simplified diagram of an IC 100, in accordance with some embodiments of the disclosure. A logic circuit 10 of the IC 100 includes a plurality of logic cells STD_1 through STD_20. In some embodiments, the logic cells STD_1 through STD_20 are the standard cells (e.g., inverter (INV), AND, OR, NAND, NOR, Flip-Flop, SCAN, etc.), a combination thereof or specific functional cells. Furthermore, the logic functions of the logic cells STD_1 through STD_20 may be the same or different. For example, the logic cells STD_1 through STD_20 may be the standard cells corresponding to the same logic gates or different logic gates. Furthermore, each of the logic cells STD_1 through STD_20 includes a plurality of transistors. In some embodiments, the logic cells STD_1 through STD_20 corresponding to the same function or operation may have the same circuit configuration with different transistor sizes and different semiconductor structures.

In FIG. 1, the logic cells STD_1 through STD_20 have the same cell width CW in the layout. The logic cells STD_1 through STD_5 are arranged in a first column, the logic cells STD_6 through STD_10 are arranged in a second column, the logic cells STD_11 through STD_15 are arranged in a third column, and the logic cells STD_16 through STD_20 are arranged in a fourth column. Furthermore, the logic cells STD_1 through STD_20 may have the same or different cell heights in the layout. For example, the logic cells STD_1 and STD_2 have the same cell height CH1 and the logic cells STD_3 and STD_4 have the same cell height CH2, and the cell height CH2 is greater than the cell height CH1.

In some embodiments, the logic cells STD_1 through STD_20 have the same cell height in the layout. Furthermore, the logic cells STD_1 through STD_20 may have the same or different cell widths in the layout.

In the logic cells STD_1 through STD_5, the NMOS transistors are formed in a P-type well region PW1, and the PMOS transistors are formed in an N-type well region NW1. In the logic cells STD_6 through STD_10, the NMOS transistors are formed in a P-type well region PW2, and the PMOS transistors are formed in the N-type well region NW1, and the N-type well region NW1 is located between the P-type well regions PW1 and PW2.

In the logic cells STD_11 through STD_15, the NMOS transistors are formed in the P-type well region PW2, and the PMOS transistors are formed in an N-type well region NW2. In the logic cells STD_16 through STD_20, the NMOS transistors are formed in a P-type well region PW3, and the PMOS transistors are formed in the N-type well region NW2, and the N-type well region NW2 is located between the P-type well regions PW2 and PW3. It should be noted that the number and the configuration of the STD_1 through STD_20 are used as an example, and not to limit the disclosure.

Figure 2A:
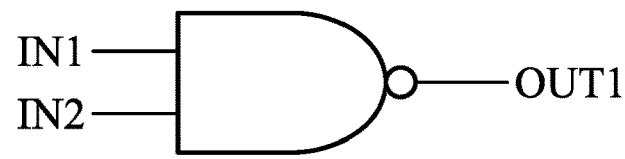
FIG. 2A illustrates the logic symbol of the logic cell STD_8 of FIG. 1, in accordance with some embodiments of the disclosure.
Figure 2B:
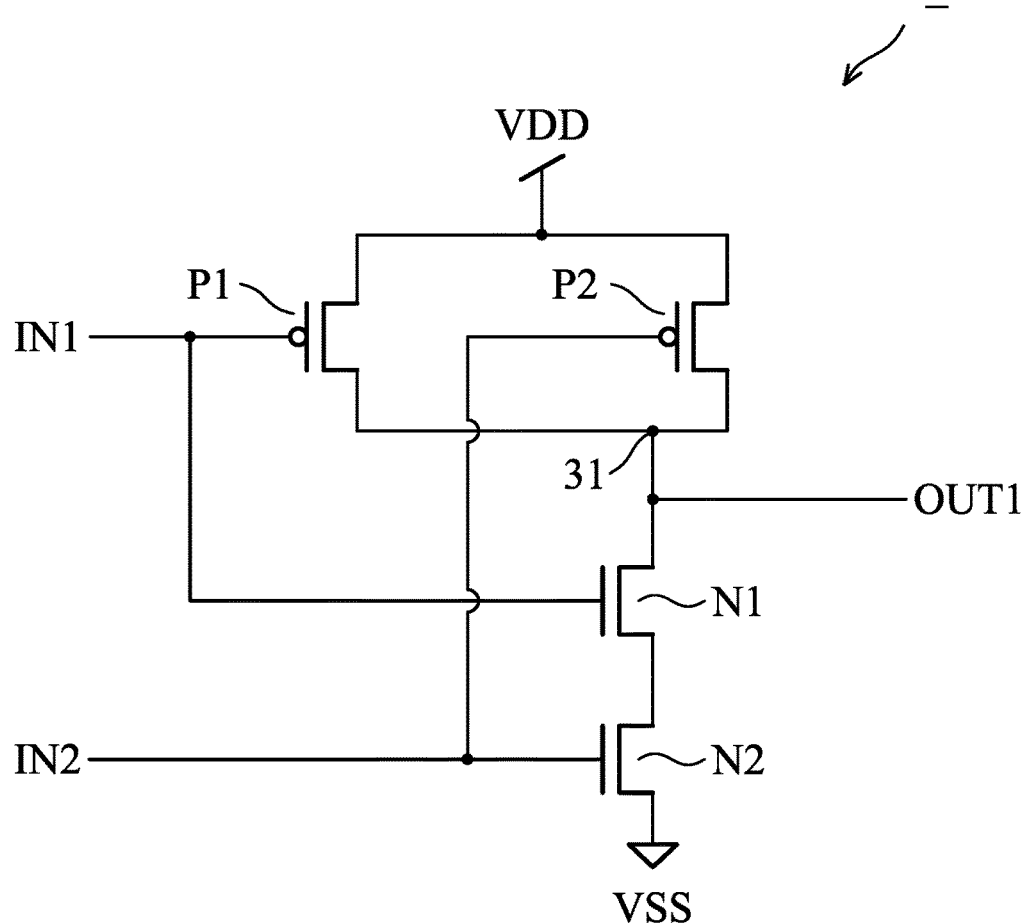
FIG. 2B is a circuit diagram of the logic cell STD_8 in FIG. 2A, in accordance with some embodiments of the disclosure.

FIG. 2A illustrates the logic symbol of the logic cell STD_8 of FIG. 1, in accordance with some embodiments of the disclosure. FIG. 2B is a circuit diagram of the logic cell STD_8 in FIG. 2A, in accordance with some embodiments of the disclosure. The logic cell STD_8 is a NAND logic gate configured to provide an output signal OUT1 according two input signals IN1 and IN2. The NAND logic gate includes two PMOS transistors P1 and P2 and two NMOS transistors N1 and N2. In some embodiments, the two PMOS transistors P1 and P2 and two NMOS transistors N1 and N2 may be planar MOS transistors or fin field effect transistors (FinFETs) with single fin or multiple-fin.

In the NAND logic gate, the PMOS transistors P1 and P2 are coupled in parallel between a node 31 and a power supply VDD. The NMOS transistor N1 is coupled between the node 31 and the NMOS transistor N2, and the NMOS transistor N2 is coupled between the NMOS transistor N1 and a ground VSS. The input signal IN1 is input to the gates of the PMOS transistor P1 and the NMOS transistor N1, and the input signal IN2 is input to the gates of the PMOS transistor P2 and the NMOS transistor N2. Furthermore, the output signal OUT1 is provided at the node 31.

Figure 3A:
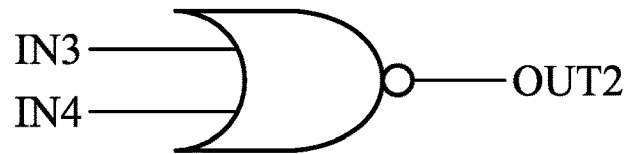
FIG. 3A illustrates the logic symbol of the logic cell STD_9 of FIG. 1, in accordance with some embodiments of the disclosure.
Figure 3B:
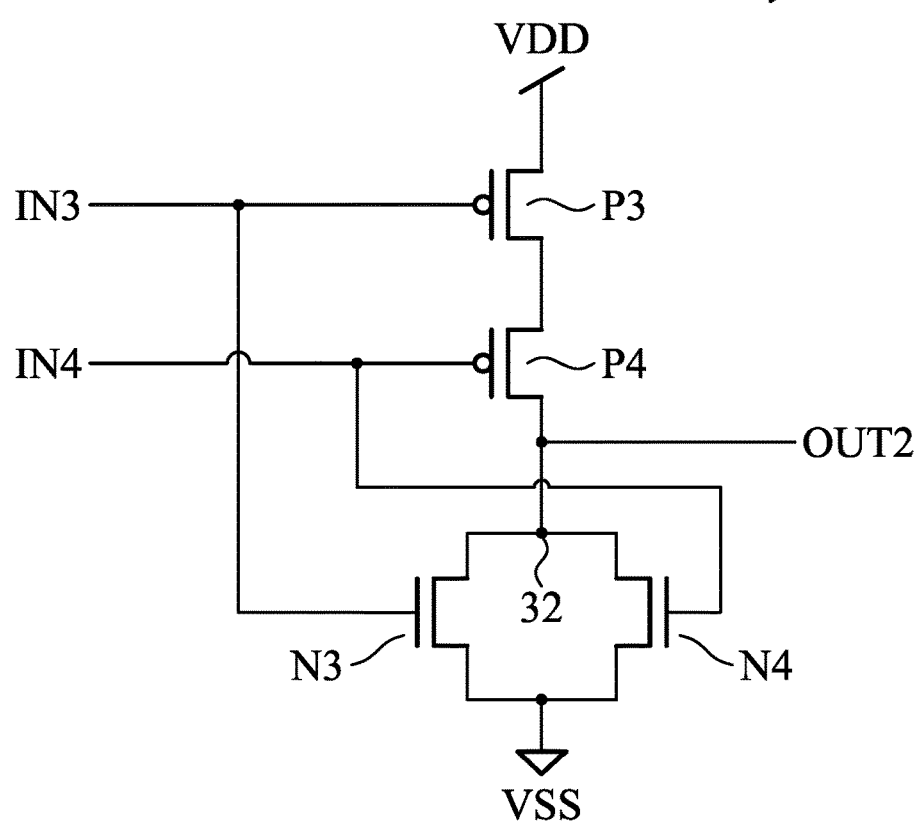
FIG. 3B is a circuit diagram of the logic cell STD_9 in FIG. 3A, in accordance with some embodiments of the disclosure.

FIG. 3A illustrates the logic symbol of the logic cell STD_9 of FIG. 1, in accordance with some embodiments of the disclosure. FIG. 3B is a circuit diagram of the logic cell STD_9 in FIG. 3A, in accordance with some embodiments of the disclosure. The logic cell STD_9 is a NOR logic gate configured to provide an output signal OUT2 according two input signals IN3 and IN4. The NOR logic gate includes two PMOS transistors P3 and P4 and two NMOS transistors N3 and N4. In some embodiments, the two PMOS transistors P3 and P4 and two NMOS transistors N3 and N4 may be planar MOS transistors or fin field effect transistors (FinFETs) with single fin or multiple-fin.

In the NOR logic gate, the PMOS transistor P3 is coupled between a power supply VDD and the PMOS transistor P4, and the PMOS transistor P4 is coupled between the PMOS transistor P3 and a node 32. The NMOS transistors N3 and N4 are coupled in parallel between the node 32 and a ground VSS. The input signal IN3 is input to the gates of the PMOS transistor P3 and the NMOS transistor N3, and the input signal IN4 is input to the gates of the PMOS transistor P4 and the NMOS transistor N4. Furthermore, the output signal OUT2 is provided at the node 32.

Figure 4:
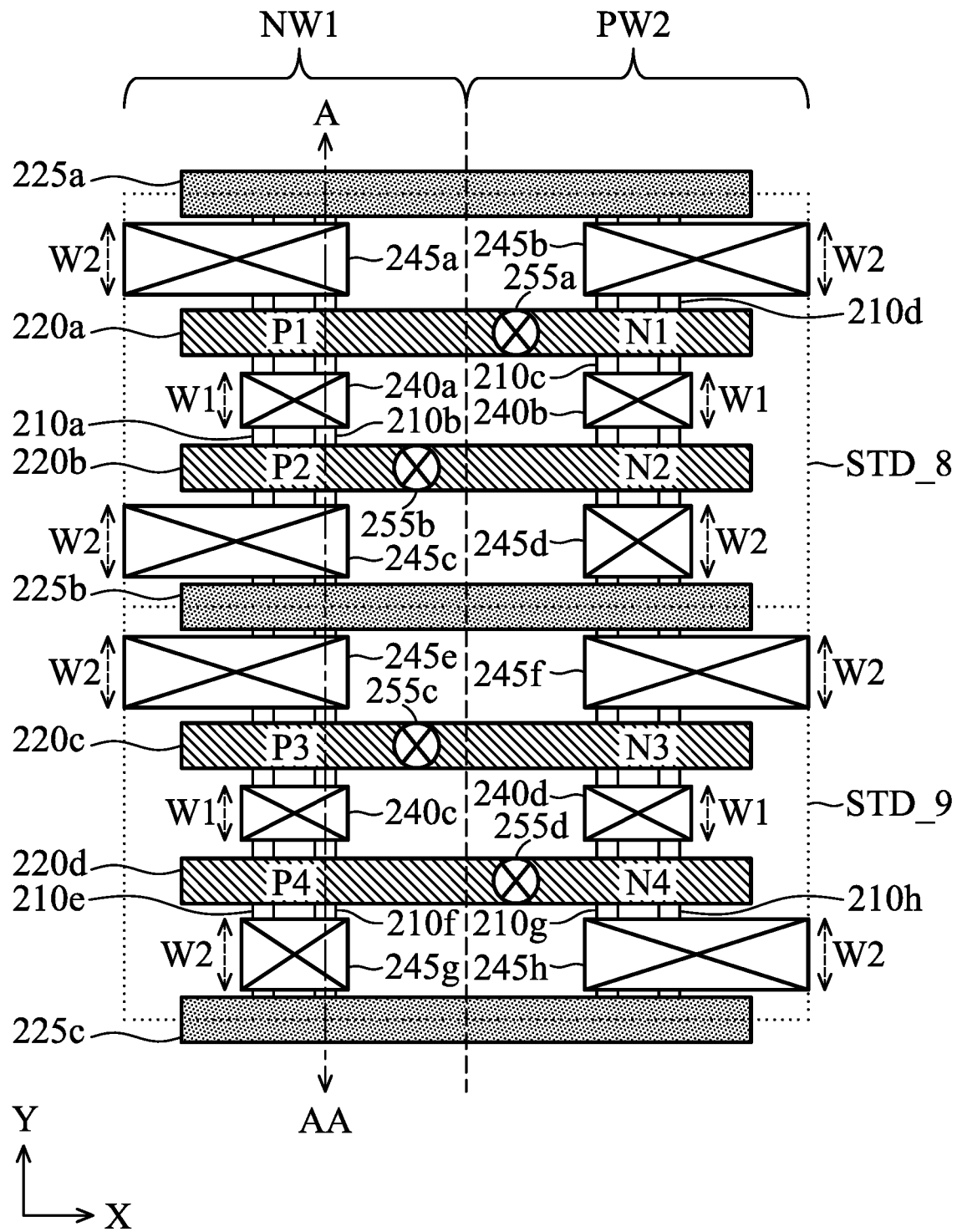
FIG. 4 illustrates the layout of the semiconductor structure of the logic cells STD_8 and STD_9, in accordance with some embodiments of the disclosure.

FIG. 4 illustrates the layout of the semiconductor structure of the logic cells STD_8 and STD_9, in accordance with some embodiments of the disclosure. In FIG. 4, the NAND logic gate of FIGS. 2A and 2B is implemented in the logic cell STD_8, and the NOR logic gate of FIGS. 3A and 3B is implemented in the logic cell STD_9. The transistors of the logic cells STD_8 and STD_9 are dual-fin FETs.

In the logic cell STD_8 of FIG. 4, the semiconductor fins 210a and 210b extending in the Y-direction are formed over the N-type well region NW1, and the semiconductor fins 210c and 210d extending in the Y-direction are formed over the P-type well region PW2. A metal gate electrode 220a extending in the X-direction forms the PMOS transistor P1 with an underlying active region formed by the semiconductor fins 210a and 210b over the N-type well region NW1. Furthermore, the metal gate electrode 220a forms the NMOS transistor N1 with an underlying active region formed by the semiconductor fins 210c and 210d in the P-type well region PW2. In other words, the metal gate electrode 220a is shared by the NMOS transistor N1 and the PMOS transistor P1. In some embodiments, the metal gate electrode 220a is coupled to a conductive line (not shown) extending in the Y-direction through a gate contact 255a and a via (not shown), and the conductive line is configured to connect the metal gate electrode 220a to an overlying level for receiving the input signal IN1.

In the logic cell STD_8, a metal gate electrode 220b extending in the X-direction forms the PMOS transistor P2 with an underlying active region formed by the semiconductor fins 210a and 210b over the N-type well region NW1. Furthermore, the metal gate electrode 220b forms the NMOS transistor N2 with an underlying active region formed by the semiconductor fins 210c and 210d in the P-type well region PW2. In other words, the metal gate electrode 220b is shared by the NMOS transistor N2 and the PMOS transistor P2. The metal gate electrode 220b is coupled to a conductive line (not shown) extending in the Y-direction through a gate contact 255b and a via (not shown), and the conductive line is configured to connect the metal gate electrode 220b to an overlying level for receiving the input signal IN2.

In the logic cell STD_8, the dielectric-base gates 225a and 225b extending in the X-direction are dummy gates. The gate electrodes 220a and 220b are arranged between the dielectric-base dummy gates 225a and 225b, and the NMOS transistors N1 and N2 and the PMOS transistors P1 and P2 are surrounded by the dielectric-base dummy gates 225a and 225b. In other words, the dielectric-base dummy gates 225a and 225b are arranged in the boundary of the logic cell STD_8.

In the logic cell STD_8, the source region of the PMOS transistor P1 is coupled to an overlying level through the second contact 245a for coupling the power supply VDD. Furthermore, the source region of the PMOS transistor P2 is coupled to an overlying level through the second contact 245c for coupling the power supply VDD. Similarly, the source region of the NMOS transistor N2 is coupled to an overlying level through the second contact 245d for coupling the ground VSS. The drain regions of the PMOS transistors P1 and P2 are coupled to a first contact 240a, and the drain region of the NMOS transistor N1 is coupled to a second contact 245b. Thus, the drain regions of the PMOS transistors P1 and P2 are coupled to the drain region of the NMOS transistor N1 through the first contact 240a, an overlying level, and the second contact 245b. Furthermore, the source region of the NMOS transistor N1 and the drain region of the NMOS transistor N2 are coupled to the first contact 240b.

In the logic cell STD_9, the semiconductor fins 210e and 210f extending in the Y-direction are formed over the N-type well region NW1, and the semiconductor fins 210g and 210h extending in the Y-direction are formed over the P-type well region PW2. A metal gate electrode 220c extending in the X-direction forms the PMOS transistor P3 with an underlying active region formed by the semiconductor fins 210e and 210f over the N-type well region NW1. Furthermore, the gate electrode 220c forms the NMOS transistor N3 with an underlying active region formed by the semiconductor fins 210g and 210h in the P-type well region PW2. In other words, the metal gate electrode 220c is shared by the NMOS transistor N3 and the PMOS transistor P3. The metal gate electrode 220c is coupled to a conductive line (not shown) extending in the Y-direction through a gate contact 255c and a via (not shown), and the conductive line is configured to connect the metal gate electrode 220c to an overlying level for receiving the input signal IN3.

In the logic cell STD_9, a metal gate electrode 220d extending in the X-direction forms the PMOS transistor P4 with an underlying active region formed by the semiconductor fins 210e and 210f over the N-type well region NW1. Furthermore, the metal gate electrode 220d forms the NMOS transistor N4 with an underlying active region formed by the semiconductor fins 210g and 210h in the P-type well region PW2. In other words, the metal gate electrode 220d is shared by the NMOS transistor N4 and the PMOS transistor P4. The metal gate electrode 220d is coupled to a conductive line (not shown) extending in the Y-direction through a gate contact 255d and a via (not shown), and the conductive line is configured to connect the metal gate electrode 220d to an overlying level for receiving the input signal IN4.

In the logic cell STD_9, the dielectric-base gates 225b and 225c extending in the X-direction are dummy gates. The gate electrodes 220c and 220d are arranged between the dielectric-base dummy gates 225b and 225c, and the NMOS transistors N3 and N4 and the PMOS transistors P3 and P4 are surrounded by the dielectric-base dummy gates 225b and 225c. In other words, the dielectric-base dummy gates 225b and 225c are arranged in the boundary of the logic cell STD_9.

In the logic cell STD_9, the source region of the PMOS transistor P3 is coupled to an overlying level through the second contact 245e for coupling the power supply VDD. Similarly, the source regions of the NMOS transistors N3 and N4 are coupled to an overlying level through the second contacts 245f and 245h, respectively, for coupling the ground VSS. The drain regions of the NMOS transistors N3 and N4 are coupled to a first contact 240d. The drain region of the PMOS transistor P4 is coupled to a second contact 245g. Thus, the drain regions of the NMOS transistors N3 and N4 are coupled to the drain region of the PMOS transistor P4 through the first contact 240d, an overlying level, and the second contact 245g. Furthermore, the source region of the PMOS transistor P4 and the drain region of the PMOS transistor P3 are coupled to the first contact 240c.

In some embodiments, the structure of the gate electrodes 220a through 220d includes multiple material structure selected from a group consisting of metals/high-K dielectric structure, Al/refractory metals/high-K dielectric structure, W/refractory metals/high-K dielectric, Cu/refractory metals/high-K dielectric, silicide/high-K dielectric structure, or a combination thereof. The high-K dielectric is located between the metal layers and the channel regions of the transistors. The metal gate top may include a Nitride layer or a high-K dielectric layer.

In some embodiments, the semiconductor fins 210a, 210b, 210e and 210f formed on the N-type well region NW1 include an appropriate concentration of N-type dopants (e.g., phosphorous (such as 31P), arsenic, or a combination thereof). In some embodiments, the semiconductor fins 210c, 210d, 210g and 210h formed on the P-type well region PW2 include an appropriate concentration of P-type dopants (e.g., boron (such as 11B), boron, boron fluorine ($BF_2$), or a combination thereof).

In some embodiments, the source/drain regions of the PMOS transistors P1 through P4 are formed by the P-type doping region that includes an epitaxy material. The epitaxy material is selected from a group consisting of SiGe, or SiGeC, or Ge, or Si, or a combination thereof.

In some embodiments, the source/drain regions of the NMOS transistors N1 through N4 are formed by the N-type doping region that includes an epitaxy material. The epitaxy material is selected from a group consisting of SiP content, SiC content, SiPC, SiAs, Si, or a combination thereof.

In some embodiments, the first contacts 240a through 240d and the second contacts 245a through 245h are coupled to the respective overlying levels through the corresponding vias. In some embodiments, the via includes a metal plug made of the same material.

In some embodiments, each of the first contacts 240a through 240d and each of the second contacts 245a through 245h includes a metal plug made of the same material. In some embodiments, the material of the metal plug is selected from a group consisting of Ti, TiN, TaN, Co, Ru, Pt, W, Al, Cu, or a combination thereof.

In some embodiments, each of the dielectric-base dummy gates 225a through 225c includes the gate material formed by the single dielectric layer or multiple layers and selected from a group consisting of $SiO_2$, SiOC, SiON, SiOCN, Carbon content oxide, Nitrogen content oxide, Carbon and Nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, or a combination thereof.

In FIG. 4, the second contacts 245a through 245h are arranged adjacent to the dielectric-base dummy gates 225a through 225c, and the first contacts 240a through 240d are arranged separated from the dielectric-base dummy gates 225a through 225c. For example, in the logic cell STD_8, the second contacts 245a and 245b are located between the dielectric-base dummy gate 225a and the metal gate electrode 220a, and the second contacts 245c and 245d are located between the dielectric-base dummy gate 225b and the metal gate electrode 220b. Furthermore, the first contacts 240a and 240b are located between the two adjacent gate electrodes 220a and 220b.

Each of the first contacts is located between the two adjacent gate electrodes and has a width W1 along the Y-direction. Each of the second contacts is located between the gate electrode and the dielectric-base dummy gate and has a width W2 along the Y-direction. It should be noted that the width W2 of the second contact is greater than the width W1 of the first contact.

In some embodiments, the width dimension ratio of the width W2 to the width W1 is greater than 1.1, e.g., W2/W1>1.1. In some embodiments, the width dimension ratio of the width W2 to the width W1 is within a range of 1.05 to 1.25.

In some embodiments, the first contacts 240a through 240d have a rectangular shape. Each of the first contacts 240a through 240d has a longer side (e.g., the length) along the X-direction and a narrow side (e.g., the width) along the Y-direction. In other words, the routing direction of the longer side is parallel to the gate electrodes 220a through 220d and the dielectric-base dummy gates 225a through 225c. In some embodiments, the dimension ratio of the longer side to the narrow side is larger than 1.5.

In some embodiments, the second contacts 245a through 245h have a rectangular shape. Each of the second contacts 245a through 245h has a longer side (e.g., the length) along the X-direction and a narrow side (e.g., the width) along the Y-direction. In other words, the routing direction of the longer side is parallel to the gate electrodes 220a through 220d and the dielectric-base dummy gates 225a through 225c. In some embodiments, the dimension ratio of the longer side to the narrow side is larger than 1.5.

In some embodiments, for the PMOS transistors P1 through P4 and the NMOS transistors N1 through N4, the first contact 240a through 240d and the second contacts 245a through 245h corresponding to the source/drain regions and the gate contacts 255a and 255d corresponding to the gate regions have different shapes in the layout. For example, the first contact 240a through 240d and the second contacts 245a through 245h have a rectangular shape, and the gate contacts 255a and 255d have a round shape.

Figure 5:
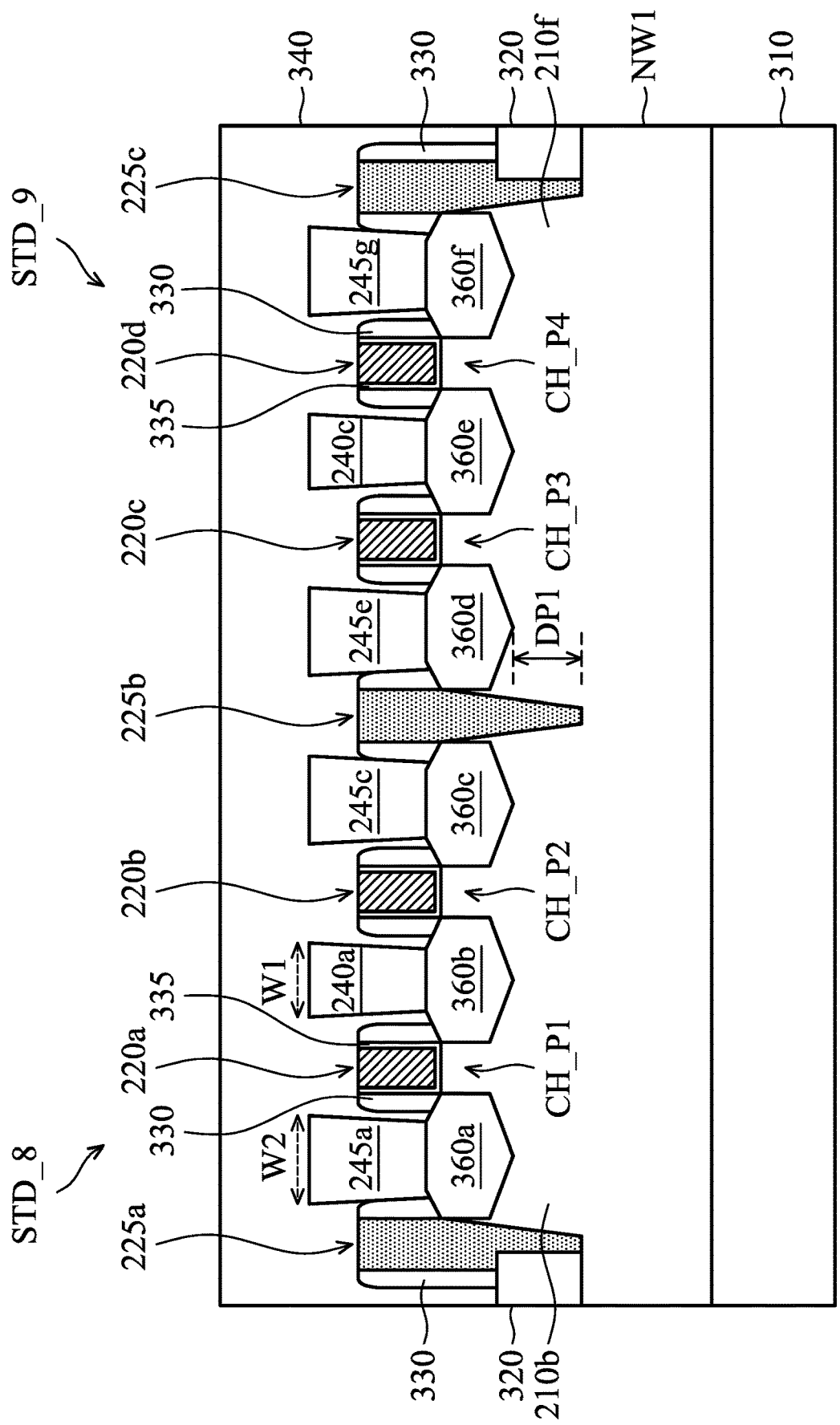
FIG. 5 illustrates a cross-sectional view of the semiconductor structure of the logic cells STD_8 and STD_9 along line A-AA in FIG. 4, in accordance with some embodiments of the disclosure.

FIG. 5 illustrates a cross-sectional view of the semiconductor structure of the logic cells STD_8 and STD_9 along line A-AA in FIG. 4, in accordance with some embodiments of the disclosure. The N-type well region NW1 is formed over a semiconductor substrate 310. In some embodiments, the substrate 310 is a Si substrate. In some embodiments, the material of the substrate 310 is selected from a group consisting of bulk-Si, SiP, SiGe, SiC, SiPC, Ge, SOI-Si, SOI-SiGe, III-VI material, or a combination thereof.

The semiconductor fins 210b and 210f are formed on the N-type well region NW1. In some embodiments, the semiconductor fins 210b and 210f include an appropriate concentration of N-type dopants (e.g., phosphorous (such as 31P), arsenic, or a combination thereof). Furthermore, the semiconductor fins 210b and 210f are separated from the shallow trench isolation (STI) 320 by the dielectric-base dummy gates 225a and 225c, respectively.

The P-type doping regions 360a through 360c form the source/drain regions of PMOS transistors P1 and P2 in the logic cell STD_8 on the semiconductor fin 210b. The second contacts 245a and 245c are formed on the P-type doping regions 360a and 360c, respectively. Furthermore, the first contact 240a is formed on the P-type doping region 360b. The P-type doping regions 360d through 360f form the source/drain regions of PMOS transistors P3 and P4 in the logic cell STD_9 on the semiconductor fin 210f. The second contacts 245e and 245g are formed on the P-type doping regions 360d and 360f, respectively. Furthermore, the first contact 240c is formed on the P-type doping region 360e.

In some embodiments, the source/drain silicide regions (not shown) are formed on the P-type doping regions 360a through 360f. In some embodiments, each of the first contacts 240a and 240c and each of the second contacts 245a, 245c, 245e and 245g includes a metal plug (not shown) and a high-K dielectric (not shown) formed on the sidewall of the metal plug. In other words, the metal plug is surrounded by the high-K dielectric. In order to simplify the description, the source/drain silicide regions, the metal plugs, and the high-K dielectric will be omitted.

The metal gate electrode 220a is formed over the gate dielectrics 335 and is positioned over a top surface of the semiconductor fin 210b and between the P-type doping regions 360a and 360b. The semiconductor fin 210b overlapping the metal gate electrode 220a, may serve as a channel region CH_P1 of the PMOS transistor P1 in the logic cell STD_8. Furthermore, the spacers 330 are formed on opposite sides of the metal gate electrode 220a. Thus, the metal gate electrode 220a, the corresponding gate dielectrics 335 and the corresponding spacers 330 over the semiconductor fin 210b form a gate structure for the PMOS transistor P1.

The metal gate electrode 220b is formed over the gate dielectrics 335 and is positioned over a top surface of the semiconductor fin 210b and between the P-type doping regions 360b and 360c. The semiconductor fin 210b overlapping the metal gate electrode 220b, may serve as a channel region CH_P2 of the PMOS transistor P2 in the logic cell STD_8. Furthermore, the spacers 330 are formed on opposite sides of the metal gate electrode 220b. Thus, the metal gate electrode 220b, the corresponding gate dielectrics 335 and the corresponding spacers 330 over the semiconductor fin 210b form a gate structure for the PMOS transistor P2.

The metal gate electrode 220c is formed over the gate dielectrics 335 and is positioned over a top surface of the semiconductor fin 210f and between the P-type doping regions 360d and 360e. The semiconductor fin 210f overlapping the metal gate electrode 220c, may serve as a channel region CH_P3 of the PMOS transistor P3 in the logic cell STD_9. Furthermore, the spacers 330 are formed on opposite sides of the metal gate electrode 220c. Thus, the metal gate electrode 220c, the corresponding gate dielectrics 335 and the corresponding spacers 330 over the semiconductor fin 210f form a gate structure for the PMOS transistor P3.

The metal gate electrode 220d is formed over the gate dielectrics 335 and is positioned over a top surface of the semiconductor fin 210f and between the P-type doping regions 360e and 360f. The semiconductor fin 210f overlapping the metal gate electrode 220d, may serve as a channel region CH_P4 of the PMOS transistor P4 in the logic cell STD_9. Furthermore, the spacers 330 are formed on opposite sides of the metal gate electrode 220d. Thus, the metal gate electrode 220d, the corresponding gate dielectrics 335 and the corresponding spacers 330 over the semiconductor fin 210f form a gate structure for the PMOS transistor P4.

In some embodiments, the channel regions CH_P1 through CH_P4 of the PMOS transistors P1 through P4 are SiGe channel region, and the Ge atomic concentration is within a range of 5% to 35%.

Similar to the gate electrodes 220a through 220d, the spacers 330 are formed on opposite sides of each of the dielectric-base dummy gates 225a through 225c. Furthermore, the dielectric-base dummy gates 225a through 225c are located upon the edge of the semiconductor fins 210b and 210f. The dielectric-base dummy gate 225a is arranged upon the left edge of the semiconductor fin 210b, and the semiconductor fin 210b is separated from the STI 320 by the dielectric-base dummy gate 225a. Furthermore, the dielectric-base dummy gate 225c is arranged upon the right edge of the semiconductor fin 210f, and the semiconductor fin 210f is separated from the STI 320 by the dielectric-base dummy gate 225c.

The dielectric-base dummy gate 225b is arranged upon the right edge of the semiconductor fin 210b and the left edge of the semiconductor fin 210f. Therefore, the P-type doping regions 360c and 360d are separated from each other by the dielectric-base dummy gate 225b. In some embodiments, the semiconductor fins 210b and 210f are separated from each other by the dielectric-base dummy gate 225b. Furthermore, the dielectric-base dummy gates 225a through 225c are deeper than the P-type doping regions 360a through 360f. In some embodiments, the depth of the dielectric-base dummy gates 225a through 225c is at least 20 nm deeper than the source/drain regions of the transistors formed by the P-type doping regions 360a through 360f, e.g. DP1>20 nm.

In some embodiments, the depth of the dielectric-base dummy gate between the two adjacent logic cells is determined according to the isolation margin of the source/drain region of one logic cell to the source/drain region of another logic cell for field isolation purpose. For example, the depth of the dielectric-base dummy gate 225b between the two adjacent logic cells STD_8 and STD_9 is determined according to the isolation margin of the source/drain region formed by the P-type doping region 360c of the logic cell STD_8 to the source/drain region formed by the P-type doping region 360d of the logic cell STD_9.

In some embodiments, the width of the dielectric-base dummy gates 225a through 225c is substantially the same as that of the gate electrodes 220a through 220d, e.g., the channel lengths of the channel regions CH_P1 through CH_P4. In some embodiments, the width of the dielectric-base dummy gates 225a through 225c and the width of the gate electrodes 220a through 220d are within a range of 2 nm to 30 nm.

The spacers 330 of the dielectric-base dummy gate 225a through 225c and the gate electrodes 220a through 220d are formed by a single dielectric layer or multiple dielectric layers with material selected from a group consisting of $SiO_2$, SiON, $Si_3N_4$, SiOCN, low K dielectric (K<3.5) material or a combination thereof.

Inter-Layer Dielectric (ILD) layer 340 is formed over the gate electrodes 220a through 220d, the dielectric-base dummy gate 225a through 225c and the spacer 330. Furthermore, The ILD 340 is formed over the STI 320 and the first contacts 240a and 240c and the second contacts 245a, 245c, 245e and 245g. The ILD layer 340 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

In the logic cell STD_8, the second contact 245a is formed on the P-type doping region 360a between the metal gate electrode 220a and the dielectric-base dummy gate 225a. The left side of the second contact 245a is in contact with (e.g., physically touches) the spacer 330 of the dielectric-base dummy gate 225a, and the right side of the second contact 245a is separated from the spacer 330 of the metal gate electrode 220a by the ILD layer 340. Similarly, the second contact 245c is formed on the P-type doping region 360c between the metal gate electrode 220b and the dielectric-base dummy gate 225b. The right side of the second contact 245c is in contact with the spacer 330 of the dielectric-base dummy gate 225b, and the left side of the second contact 245c is separated from the spacer 330 of the metal gate electrode 220b by the ILD layer 340. Furthermore, the first contact 240a is formed on the P-type doping region 360b between the gate electrodes 220a and 220b. The first contact 240a is separated from the spacers 330 of the gate electrodes 220a and 220b by the ILD layer 340. As described above, the width W2 of the second contacts 245a and 245c is greater than the width W1 of the first contact 240a.

In the logic cell STD_9, the second contact 245e is formed on the P-type doping region 360d between the metal gate electrode 220c and the dielectric-base dummy gate 225b. The left side of the second contact 245e is in contact with the spacer 330 of the dielectric-base dummy gate 225b, and the right side of the second contact 245e is separated from the spacer 330 of the metal gate electrode 220c by the ILD layer 340. Similarly, the second contact 245g is formed on the P-type doping region 360f between the metal gate electrode 220d and the dielectric-base dummy gate 225c. The right side of the second contact 245g is in contact with the spacer 330 of the dielectric-base dummy gate 225c, and the left side of the second contact 245g is separated from the spacer 330 of the metal gate electrode 220d by the ILD layer 340. Furthermore, the first contact 240c is formed on the P-type doping region 360e between the gate electrodes 220c and 220d. The first contact 240c is separated from the spacers 330 of the gate electrodes 220c and 220d by the ILD layer 340. As described above, the width W2 of the second contacts 245e and 245f is greater than the width W1 of the first contact 240c.

In FIG. 5, the P-type doping regions 360c and 360d are separated from each other by an isolation structure formed by the dielectric-base dummy gates 225b. Compared with STI isolation purpose, the depth of the dielectric-base dummy gates 225b is shallower due to it is served for field isolation of the two adjacent logic cells, e.g., the source/drain regions formed by the P-type/N-type doping region of the first logic cell to the source/drain regions formed by the P-type/N-type doping region of the second logic cell. Furthermore, the width (or space) of the dielectric-base dummy gates 225b can be equal to one gate length (Lg) width and is narrow than the STI isolation. In general, the width of the STI isolation is at least one contacted poly pitch (CPP) width. Moreover, the STI isolation is formed during fin or oxide-definition (OD) related process, and the dielectric-base dummy gate is formed during gate related process.

Embodiments for semiconductor structures are provided. In a logic circuit including a plurality of logic cells, the dielectric-base dummy gates serve for the adjacent cell isolation purpose and larger contact implementation without extra cost or extra area. In each logic cell, the dielectric-base dummy gates are arranged in the boundary of the logic cell, and the gate electrodes of the transistors are arranged between the dielectric-base dummy gates. Furthermore, each of the first contacts is located between the two adjacent gate electrodes and has a width W1. Each of the second contacts is located between the gate electrode and the dielectric-base dummy gate and has a width W2. As described above, the width W2 of the second contact is greater than the width W1 of the first contact. Furthermore, the second contact is in contact with the dielectric-base dummy gate, thereby decreasing the capacitance between the second contact and the dielectric-base dummy gate and improving circuit speed and power consumption in the logic cells. The second contacts have a larger contact size and also maintain the reliability margin between the second contact to the adjacent gate electrode. In other words, the contact landing Rc of the second contact is decreased, thereby increasing device performance of the logic cell.

In some embodiments, a semiconductor structure is provided. The semiconductor structure includes a semiconductor fin extending in a first direction, a plurality of transistors, and at least one dielectric-base dummy gate extending in the second direction. Each of the transistors includes a first source/drain region over the semiconductor fin, a second source/drain region over the semiconductor fin, a channel region in the semiconductor fin and between the first and second source/drain regions, and a metal gate electrode formed on the channel region and extending in a second direction that is perpendicular to the first direction. In a first transistor of the transistors, a first source/drain region is formed between the metal gate electrode of the first transistor and the metal gate electrode of a second transistor of the transistors, and a second source/drain region is formed between the metal gate electrode of the first transistor and the dielectric-base dummy gate. The first and second transistors share a semiconductor fin. The first contact of the first source/drain region is narrower than the second contact of the second source/drain region along the first direction.

In some embodiments, a semiconductor structure is provided. The semiconductor structure includes a plurality of standard cells and at least one isolation structure. Each of the transistors includes a semiconductor fin extending in a first direction, a first source/drain region over the semiconductor fin, a second source/drain region over the semiconductor fin, a channel region in the semiconductor fin and between the first and second source/drain regions, and a metal gate electrode formed on the channel region and extending in a second direction that is perpendicular to the first direction. The isolation structure is shared by a first standard cell and a second standard cell. The isolation structure includes a dielectric-base dummy gate extending in the second direction. The isolation structure is formed between the second source/drain region of a first transistor of the first standard cell and the second source/drain region of the second transistor of the second standard cell. In the first standard cell, the first source/drain region of the first transistor is formed between the metal gate electrode of the first transistor and the metal gate electrode of a third transistor within the first standard cell, and the first and third transistors share a semiconductor fin. In the second standard cell, the first source/drain region of the second transistor is formed between the metal gate electrode of the second transistor and the metal gate electrode of a fourth transistor within the second standard cell, and the second and fourth transistors share a semiconductor fin. First contacts of the first source/drain regions of the first and second transistors are narrower than second contacts of the second source/drain region of the first and second transistors along the first direction.

In some embodiments, a semiconductor structure is provided. The semiconductor structure includes a semiconductor fin extending in a first direction, a plurality of transistors and at least one dielectric-base dummy gate extending in the second direction. Each of the transistors includes a first source/drain region over the semiconductor fin, a second source/drain region over the semiconductor fin, a channel region in the semiconductor fin and between the first and second source/drain regions, and a metal gate electrode formed on the channel region and extending in a second direction that is perpendicular to the first direction. In a first transistor of the transistors, the first source/drain region is formed between the metal gate electrode of the first transistor and the metal gate electrode of a second transistor of the transistors, and the second source/drain region is formed between the metal gate electrode of the first transistor and the dielectric-base dummy gate. The first and second transistors shared the semiconductor fin. The first contact of the first source/drain region is separated from the spacer of the second metal gate electrode, and the second contact of the second source/drain region is in contact with the spacer of the dielectric-base dummy gate.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor fin extending in a first direction;
   a plurality of transistors, wherein each of the transistors comprises:
      a first source/drain region over the semiconductor fin;
      a second source/drain region over the semiconductor fin;
      a channel region in the semiconductor fin and between the first and second source/drain regions; and
      a metal gate electrode formed on the channel region and extending in a second direction that is perpendicular to the first direction; and
   at least one dielectric-base dummy gate extending in the second direction,
   wherein in a first transistor of the transistors, the first source/drain region is formed between the metal gate electrode of the first transistor and the metal gate electrode of a second transistor of the transistors, and the second source/drain region is formed between the metal gate electrode of the first transistor and the dielectric-base dummy gate,
   wherein the first and second transistors share the semiconductor fin,
   wherein a first contact of the first source/drain region is narrower than a second contact of the second source/drain region along the first direction.

2. The semiconductor structure as claimed in claim 1, wherein in the first direction, a width ratio of the second contact to the first contact is greater than 1.1.

3. The semiconductor structure as claimed in claim 1, wherein in the first direction, a width ratio of the second contact to the first contact is within a range of 1.05 to 1.25.

4. The semiconductor structure as claimed in claim 1, wherein a gate width of the dielectric-base dummy gate is the same as that of the metal gate electrode.

5. The semiconductor structure as claimed in claim 1, wherein gate widths of the dielectric-base dummy gate and the metal gate electrode are within a range of 2 nm to 30 nm.

6. The semiconductor structure as claimed in claim 1, wherein a depth of the dielectric-base dummy gate is at least 20 nm deeper than the first and second source/drain regions.

7. The semiconductor structure as claimed in claim 1, wherein spacers of the dielectric-base dummy gate and spacers of the metal gate electrode are formed by a single dielectric layer or multiple dielectric layers with material selected from a group consisting of $SiO_2$, SiON, $Si_3N_4$, SiOCN, low K dielectric material or a combination thereof.

8. The semiconductor structure as claimed in claim 1, wherein the first and second contacts are formed by a single metal layer or multiple metal layers with material selected from a group consisting of Ti, TiN, Pt, Co, Ru, W, TaN, Cu or a combination thereof.

9. The semiconductor structure as claimed in claim 1, wherein the dielectric-base dummy gate is formed by a single dielectric layer or multiple dielectric layers with material selected from a group consisting of SiO2, SiOC, SiON, SiOCN, Carbon content oxide, Nitrogen content oxide, Carbon and Nitrogen content oxide, metal oxide dielectric, Hf oxide, Ta oxide, Ti oxide, Zr oxide, Al oxide, Y oxide, multiple metal content oxide or a combination thereof.

10. The semiconductor structure as claimed in claim 1, wherein when the transistor is a PMOS transistor, the channel region comprises a SiGe channel region, and Ge atomic concentration of the SiGe channel region is within a range of 5% to 35%.

11. A semiconductor structure, comprising:
a semiconductor fin extending in a first direction;
a plurality of transistors, wherein each of the transistors comprises:
   a first source/drain region over the semiconductor fin;
   a second source/drain region over the semiconductor fin;
   a channel region in the semiconductor fin and between the first and second source/drain regions; and
   a metal gate electrode formed on the channel region and extending in a second direction that is perpendicular to the first direction; and
at least one dielectric-base dummy gate extending in the second direction,
wherein in each of the transistors, the first source/drain region is formed between the metal gate electrodes of the transistor and the adjacent transistor, and the second source/drain region is formed between the metal gate electrode of the transistor and the dielectric-base dummy gate,
wherein a first contact of the first source/drain region is narrower than a second contact of the second source/drain region along the first direction.

12. The semiconductor structure as claimed in claim 11, wherein in the first direction, a width ratio of the second contact to the first contact is greater than 1.1.

13. The semiconductor structure as claimed in claim 11, wherein a gate width of the dielectric-base dummy gate is the same as that of the metal gate electrode.

14. The semiconductor structure as claimed in claim 11, wherein gate widths of the dielectric-base dummy gate and the metal gate electrode are within a range of 2 nm to 30 nm.

15. The semiconductor structure as claimed in claim 11, wherein a depth of the dielectric-base dummy gate is at least 20 nm deeper than the first and second source/drain regions.

16. The semiconductor structure as claimed in claim 11, wherein the first and second contacts are formed by a single metal layer or multiple metal layers with material selected from a group consisting of Ti, TiN, Pt, Co, Ru, W, TaN, Cu or a combination thereof.

17. The semiconductor structure as claimed in claim 11, wherein a dimension ratio of a first side along the second direction to a second side along the first direction of the rectangular shape is larger than 1.5.

18. A semiconductor structure, comprising:
a semiconductor fin extending in a first direction;
a plurality of standard cells, wherein each of the standard cells comprises:
   a plurality of transistors formed in the semiconductor fin, wherein each of the transistors comprises:
      two source/drain regions over the semiconductor fin;
      a channel region in the semiconductor fin and between the source/drain regions; and
      a metal gate electrode formed on the channel region; and
a plurality of dielectric-base dummy gates, wherein each of the dielectric-base dummy gates is formed between two adjacent standard cells,
wherein in each of the transistors, one of the source/drain regions formed between the metal gate electrodes of the transistor and the adjacent transistor is narrower than the other source/drain region formed between the metal gate electrode of the transistor and the dielectric-base dummy gate, and a contact of the one of source/drain regions is narrower than a contact of the other source/drain region along the first direction.

19. The semiconductor structure as claimed in claim 18, wherein a gate width of the dielectric-base dummy gate is the same as that of the metal gate electrode.

20. The semiconductor structure as claimed in claim 18, wherein gate widths of the dielectric-base dummy gate and the metal gate electrode are within a range of 2 nm to 30 nm.

* * * * *